United States Patent
Lee et al.

(10) Patent No.: US 8,426,849 B2
(45) Date of Patent: Apr. 23, 2013

(54) ORGANIC ELECTROLUMINESCENT LIGHT SOURCE

(75) Inventors: Meng-Ting Lee, Taipei (TW);
Chang-Yen Wu, Taipei (TW);
Chun-Liang Lin, New Taipei (TW);
Chieh-Wei Chen, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 16 days.

(21) Appl. No.: 13/198,721

(22) Filed: Aug. 5, 2011

(65) Prior Publication Data
US 2012/0292647 A1 Nov. 22, 2012

(30) Foreign Application Priority Data
May 20, 2011 (TW) .............................. 100117780 A

(51) Int. Cl.
*H01L 33/00* (2010.01)
*H01L 51/50* (2006.01)

(52) U.S. Cl.
USPC ............ 257/40; 257/89; 257/98; 257/99; 257/E33.059; 257/E33.061; 257/E33.062; 313/503; 313/504; 313/512

(58) Field of Classification Search ............ 257/40, 257/89, 98, 99, E33.059, E33.061, E33.062; 313/503, 504, 512
See application file for complete search history.

(56) References Cited

U.S. PATENT DOCUMENTS

| | | | |
|---|---|---|---|
| 5,707,745 A | 1/1998 | Forrest et al. | |
| 5,932,895 A | 8/1999 | Shen et al. | |
| 6,166,489 A | 12/2000 | Thompson et al. | |
| 7,202,506 B1 | 4/2007 | DenBaars et al. | |
| 7,888,860 B2 * | 2/2011 | Sung et al. | 313/504 |
| 7,935,963 B2 * | 5/2011 | Anandan | 257/40 |
| 8,226,853 B2 * | 7/2012 | Oshio | 252/301.4 F |
| 2006/0188745 A1 | 8/2006 | Liao et al. | |
| 2008/0315217 A1 * | 12/2008 | Van Der Wel | 257/88 |
| 2010/0123150 A1 | 5/2010 | Anandan | |
| 2011/0073844 A1 * | 3/2011 | Pieh et al. | 257/40 |
| 2011/0233600 A1 * | 9/2011 | Lin et al. | 257/99 |

FOREIGN PATENT DOCUMENTS
TW M377528 4/2010

OTHER PUBLICATIONS

"First Office Action of China Counterpart Application", issued on Nov. 2, 2012, p. 1-p. 4, in which the listed references were cited.
Jin-Xin Chen et al., "White-Light OLED Lighting", Jan. 31, 2011, p. 139-139.

* cited by examiner

Primary Examiner — Dao H Nguyen
(74) Attorney, Agent, or Firm — Jianq Chyun IP Office

(57) ABSTRACT

An organic electroluminescent light source including a first organic electroluminescent device and a second organic electroluminescent device is provided. The first organic electroluminescent device is coupled to a first bias voltage to emit a first color light having a color temperature ranging from 2800K to 3500K. The second organic electroluminescent device is coupled to a second bias voltage to emit a second color light. The first color light and the second color light mix to generate a third color light having a color temperature ranging from 3500K to 6500K.

20 Claims, 7 Drawing Sheets

ORGANIC ELECTROLUMINESCENT LIGHT SOURCE

CROSS-REFERENCE TO RELATED APPLICATION

This application claims the priority benefit of Taiwan application serial no. 100117780, filed May 20, 2011. The entirety of the above-mentioned patent application is hereby incorporated by reference herein and made a part of this specification.

BACKGROUND

1. Technical Field

The disclosure relates to a light source and more particularly to an organic electroluminescent light source.

2. Description of Related Art

Comparing to conventional light sources such as incandescent lamps, fluorescent lamps, and the like, organic electroluminescent light source is light, mercury-free, ultraviolet radiation free, and used as a planar light source. Thus, the organic electroluminescent light source has become a new potential light source. Take a white light organic electroluminescent lamp as an example, a luminescent layer constituted by a blue organic luminescent material and a yellow organic luminescent material is mainly adopted in the conventional technique, where a suitable voltage is applied to the luminescent layer for the organic electroluminescent lamp to emit a white light with specific color temperature.

FIG. 1 is a light spectrum of a conventional organic electroluminescent device. Referring to FIG. 1, although the color temperature of the conventional organic electroluminescent lamp can be controlled by adjusting the voltage applied to the luminescent layer, the color temperature and the light intensity in the conventional organic electroluminescent lamp still have dependency therebetween. In details, when a higher voltage is applied to the luminescent layer, the color temperature of the organic electroluminescent lamp also increases. At the same time, the light intensity of the organic electroluminescent lamp increases along with the increasing color temperature. Similarly, when a lower voltage is applied to the luminescent layer, the color temperature of the organic electroluminescent lamp also decreases. The light intensity of the organic electroluminescent lamp then decreases along with the decreasing color temperature. Consequently, the conventional organic electroluminescent lamp fails to satisfy the manufacturer's needs when the manufacturer demands for light sources with high color temperature and low light intensity or light sources with low color temperature and high light intensity. Further, the color rendering index of the conventional organic electroluminescent lamp can not meet the practical demand (that is, lower than 80). Accordingly, researchers work on developing organic electroluminescent lamps with adaptive color temperature and high color rendering index.

SUMMARY

The invention is directed to an organic electroluminescent light source having adaptive color temperature.

The invention is directed to an organic electroluminescent light source including a first organic electroluminescent device and a second organic electroluminescent device. The first organic electroluminescent device is coupled to a first bias voltage to emit a first color light having a color temperature ranging from 2800K to 3500K. The second organic electroluminescent device is coupled to a second bias voltage to emit a second color light. The first color light and the second color light mix to generate a third color light having a color temperature ranging from 3500K to 6500K.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DESCRIPTION OF EMBODIMENTS

First Embodiment

Figure 1:
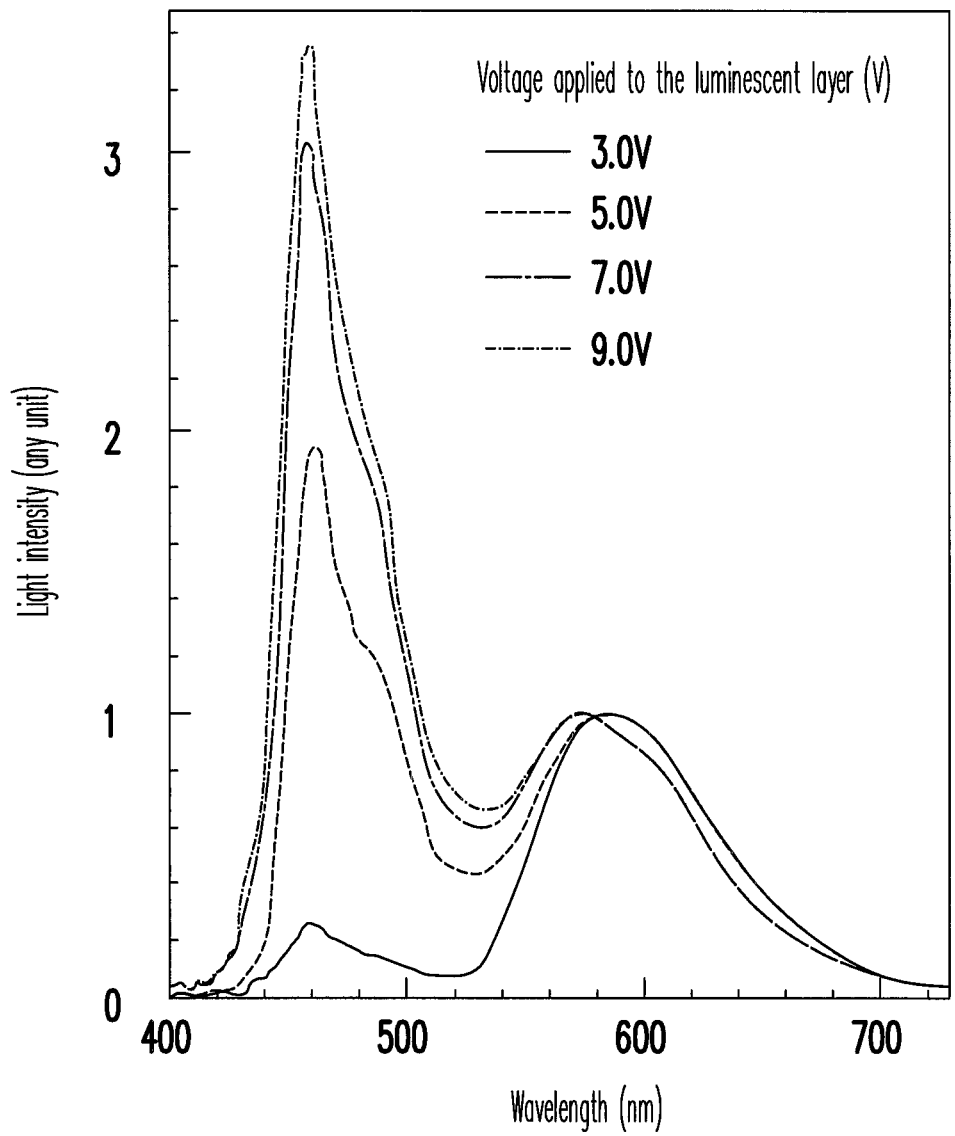
FIG. 1 is a light spectrum of a conventional organic electroluminescent device.
Figure 2:
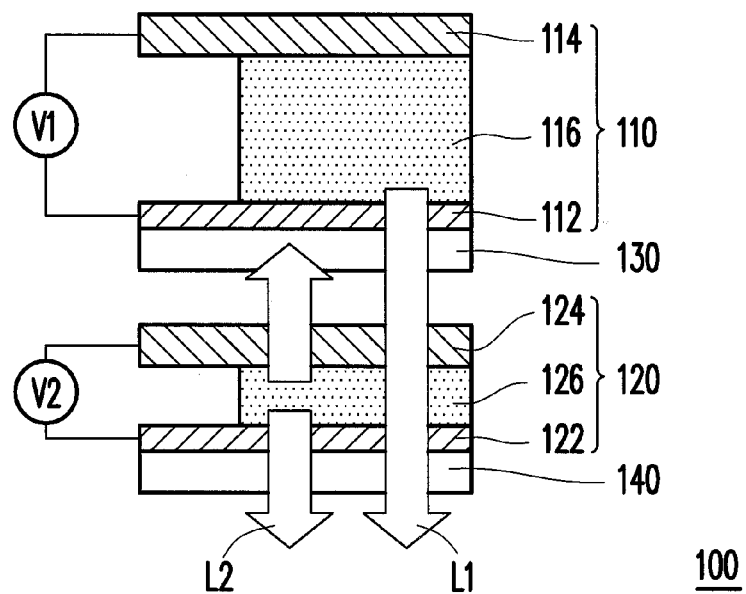
FIG. 2 is a schematic cross-sectional diagram of an organic electroluminescent light source according to a first embodiment of the invention.
Figure 3:
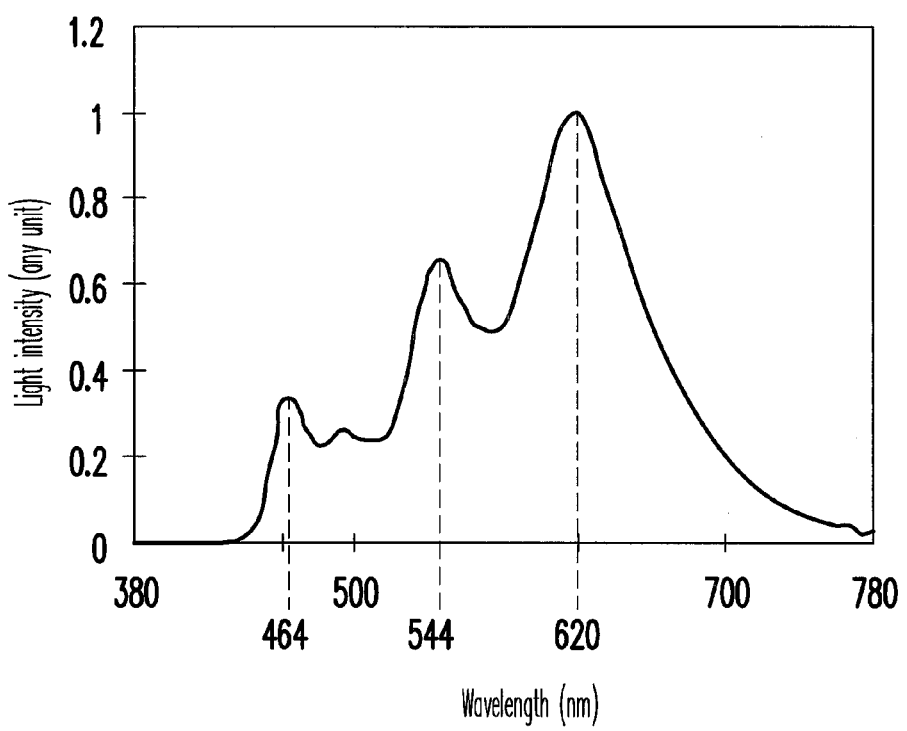
FIG. 3 illustrates a light spectrum of a first organic electroluminescent device according to the first embodiment of the invention.

FIG. 2 is a schematic cross-sectional diagram of the organic electroluminescent light source according to a first embodiment. Referring to FIG. 2, an organic electroluminescent light source 100 of the present embodiment includes a first organic electroluminescent device 110 and a second organic electroluminescent device 120. In the present embodiment, the first organic electroluminescent device 110 is coupled to a first bias voltage V1 to emit a first color light L1 having a color temperature ranging from 2800K to 3500K. For example, the first color light L1 emitted by the first organic electroluminescent device 110 is a white light having three intensity peaks. As depicted in FIG. 3, the three intensity peaks are 464 nanometer (nm), 544 nm, and 620 nm respectively; however, the invention is not limited thereto.

Referring to FIG. 2, the second organic electroluminescent device 120 of the present embodiment is coupled to a second bias voltage V2 to emit a second color light L2. For example, the second color light L2 emitted by the second organic electroluminescent device 120 of the present embodiment is a blue light and has a color temperature higher than the color temperature of the first color light. The second organic electroluminescent device 120 of the present embodiment includes a second anode 122, a second cathode 124, and a second organic electroluminescent layer 126 sandwiched between the second anode 122 and the second cathode 124. In the present embodiment, the second anode 122 and the second cathode 124 are transparent conductive electrodes, for instance. A material of the second anode 122 and the second cathode 124 includes a metal oxide or other suitable conductive oxides. For instance, a material of the second anode 122 and the second cathode 124 includes indium tin oxide (ITO), indium zinc oxide (IZO), aluminum tin oxide (ATO), aluminum zinc oxide (AZO), indium germanium zinc oxide (IGZO), or a stacked layer including two of the above.

It should be noted that, the first color light L1 emitted by the first organic electroluminescent device 110 and the second color light L2 emitted by the second organic electroluminescent device 120 mix to generate a third color light having a color temperature ranging from 3500K to 6500K. The details are illustrated in the following with the accompanying diagram FIG. 4.

Figure 4:
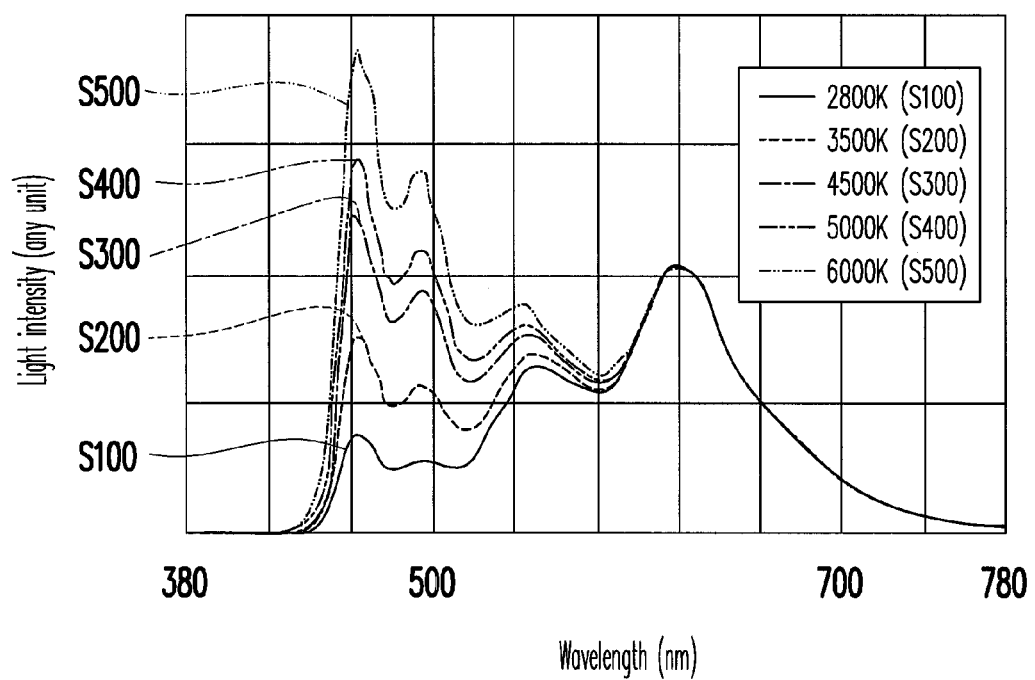
FIG. 4 illustrates a light spectrum of the organic electroluminescent light source according to the first embodiment of the invention.

FIG. 4 illustrates a light spectrum of the organic electroluminescent light source according to the first embodiment of the invention. Referring to FIG. 4, a curve S100 shows a light spectrum emitted by the organic electroluminescent light source 100 when the first organic electroluminescent device 110 is driven but the second organic electroluminescent device 120 is not driven in the present embodiment. Here, the color temperature of the organic electroluminescent light source 100 is about 2800K. The first organic electroluminescent device 110 and the second organic electroluminescent device 120 can be driven simultaneously when the manufacturer wants to use a light source with higher color temperature. Accordingly, when the first color light L1 having a lower color temperature which is emitted by the first organic electroluminescent device 110 is mixed with the second color light L2 having a higher color temperature which is emitted by the second organic electroluminescent device 120, the manufacturer obtains the third color light having a higher color temperature (e.g. 3500K) with a light spectrum as shown with a curve S200.

In addition, when the manufacturer wants to use a light source with a higher color temperature, the second bias voltage V2 can be increased to increase the light intensity of the second color light L2 having high color temperature so as to raise the color temperature of the organic electroluminescent light source 100. As illustrated in FIG. 3, when the first bias voltage V1 is fixed and the second bias voltage V2 is increased gradually, the light spectrum of the organic electroluminescent light source 100 changes from the curve S200 to curves S300, S400, S500 and the color temperature of the organic electroluminescent light source 100 also gradually increases to 4500K, 5000K, 6000K correspondingly. In other words, the color temperature of the organic electroluminescent light source 100 can be modulated along the Planckain locus by increasing the light intensity of the second organic electroluminescent device 120 in the present embodiment. Regardless of high color temperature or low color temperature, a color rendering index of the organic electroluminescent light source 100 can be larger than the practical demand (that is, 80).

It should be noted that the dependency between the color temperature and the light intensity of the organic electroluminescent light source 100 in the present embodiment is low. In other words, the manufacturer has a higher modulation flexibility in light intensity and color temperature. For instance, when the manufacturer needs a light source with high color temperature and low light intensity, a higher second bias voltage V2 can be applied to the second organic electroluminescent device 120 and the first bias voltage V1 is controlled for the organic electroluminescent light source 100 to maintain a low light intensity. As a result, the organic electroluminescent light source 100 can have high color temperature and low light intensity. Similarly, when the manufacturer needs a light source with low color temperature and high color intensity, a lower second bias voltage V2 can be applied to the second organic electroluminescent device 120 and the first bias voltage V1 is controlled for the organic electroluminescent light source 100 to maintain a high light intensity. Consequently, the organic electroluminescent light source 100 can have low color temperature and high light intensity.

Referring to FIG. 2, the organic electroluminescent light source 100 of the present embodiment further includes a first substrate 130 and a second substrate 140. The first organic electroluminescent device 110 is disposed on the first substrate 130 and the second organic electroluminescent device 120 is disposed on the second substrate 140. More specifically, the first substrate 130 carrying the first organic electroluminescent device 110 and the second substrate 140 carrying the second organic electroluminescent device 120 are stacked together. The first substrate 130 and the second substrate 140 are both transparent substrates. Accordingly, the first color light L1 emitted by the first organic electroluminescent device 110 can pass through the first substrate 130, the second organic electroluminescent device 120, and the second substrate 140 sequentially. The first color light L1 then mixes with the second color light L2 emitted by the second organic electroluminescent device 120 which passes through the second substrate 140. A material of the first substrate 130 and the second substrate 140 in the present embodiment includes glass, quartz, organic polymers, or other transparent materials.

Figure 5A:
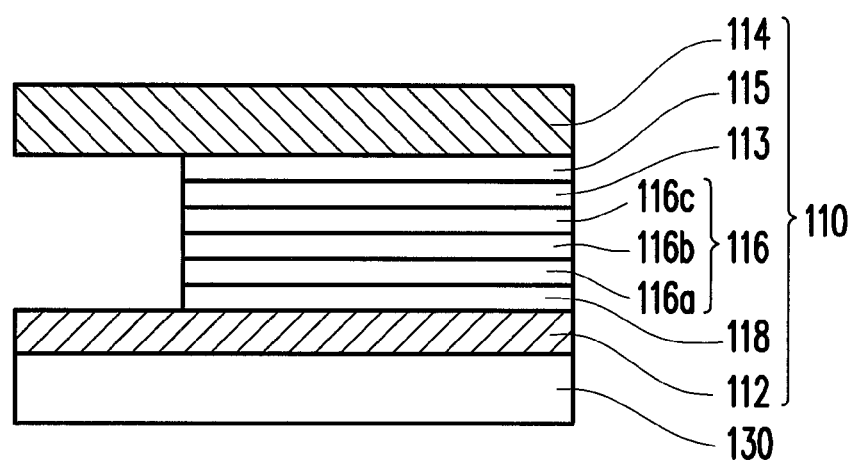
FIGS. 5A, 5B, 5C, 5D, and 5E are schematic cross-sectional diagrams showing the first organic electroluminescent device according to an embodiment of the invention.

FIG. 5A is a schematic cross-sectional diagram of the first organic electroluminescent device according to an embodiment of the invention. Referring to FIG. 5A, the first organic electroluminescent device 110 of the present embodiment includes a first anode 112, a first cathode 114, and a first organic electroluminescent layer 116 disposed between the first anode 112 and the first cathode 114. In details, the first organic electroluminescent device 110 further includes a first hole transport layer 118 sandwiched between the first anode 112 and the first organic electroluminescent layer 116, a first electron transport layer 113 sandwiched between the first organic electroluminescent layer 116 and the first cathode 114, and a first electron injection layer 115 disposed between the first electron transport layer 113 and the first cathode 114. The first organic electroluminescent layer 116 is sandwiched between the first electron transport layer 113 and the first hole transport layer 118. The first organic electroluminescent layer 116 of the present embodiment includes a first primary color organic electroluminescent layer 116a (a first color organic electroluminescent layer) having a dopant for emitting first primary color (e.g. red light), a second primary color organic electroluminescent layer 116b (a second color organic electroluminescent layer) having a dopant for emitting second primary color (e.g. green light), and a third primary color organic electroluminescent layer 116c (a third color organic electroluminescent layer) having a dopant for emitting third primary color (e.g. blue light). The first primary color organic electroluminescent layer 116a, the second primary color organic electroluminescent layer 116b, and the third primary color organic electroluminescent layer 116c are stacked between the first anode 112 and the first cathode 114.

However, the first organic electroluminescent device 110 of the invention can be of a plurality of types and is not limited to the aforementioned. In another embodiment of the invention, the first primary color organic electroluminescent layer 116a, the second primary color organic electroluminescent layer 116b, and the third primary color organic electroluminescent layer 116c in the first organic electroluminescent device 110 can be replaced with a yellow organic electroluminescent layer having a dopant for emitting yellow light and a blue organic electroluminescent layer having a dopant for emitting blue light.

Figure 5B:
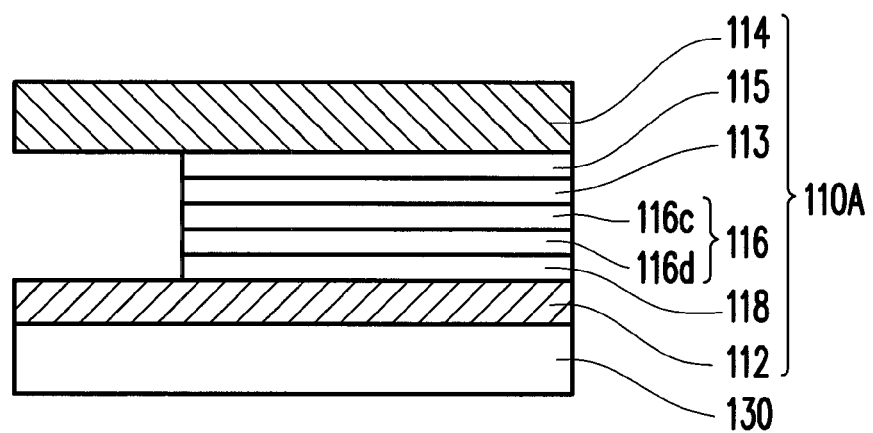

In another embodiment of the invention, the first primary color organic electroluminescent layer 116a, the second primary color organic electroluminescent layer 116b, and the third primary color organic electroluminescent layer 116c in the first organic electroluminescent device 110 as shown in FIG. 5 can be replaced with a first primary color-second primary color organic electroluminescent layer 116d having a dopant for emitting first primary color (e.g. red light) and a dopant for emitting second primary color (e.g. green light), and the third primary color organic electroluminescent layer 116c having a dopant for emitting third primary color (e.g. blue light) in a first organic electroluminescent device 100A as displayed in FIG. 5B.

Figure 5C:
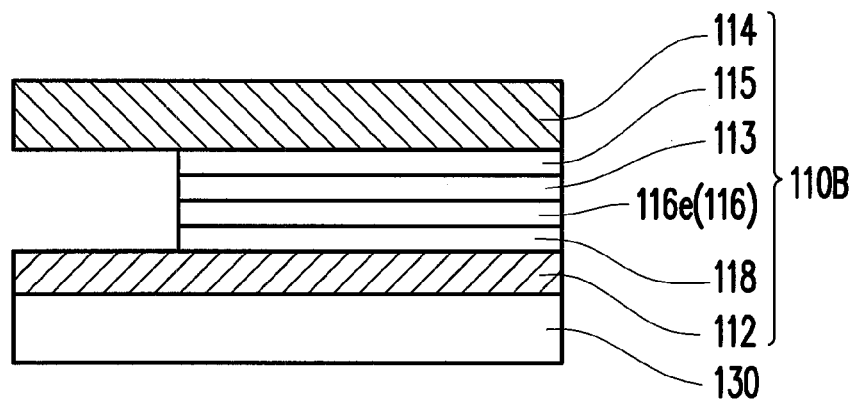

In another embodiment of the invention, the first primary color organic electroluminescent layer 116a, the second primary color organic electroluminescent layer 116b, and the third primary color organic electroluminescent layer 116c in the first organic electroluminescent device 110 can also be replaced with a first primary color-second primary color-third primary color organic electroluminescent layer 116d in a first organic electroluminescent device 110B as shown in FIG. 5C. The first primary color-second primary color-third primary color organic electroluminescent layer 116d has a dopant for emitting first primary color (e.g. red light), a dopant for emitting second primary color (e.g. green light), and a dopant for emitting third primary color (e.g. blue light).

Figure 5D:
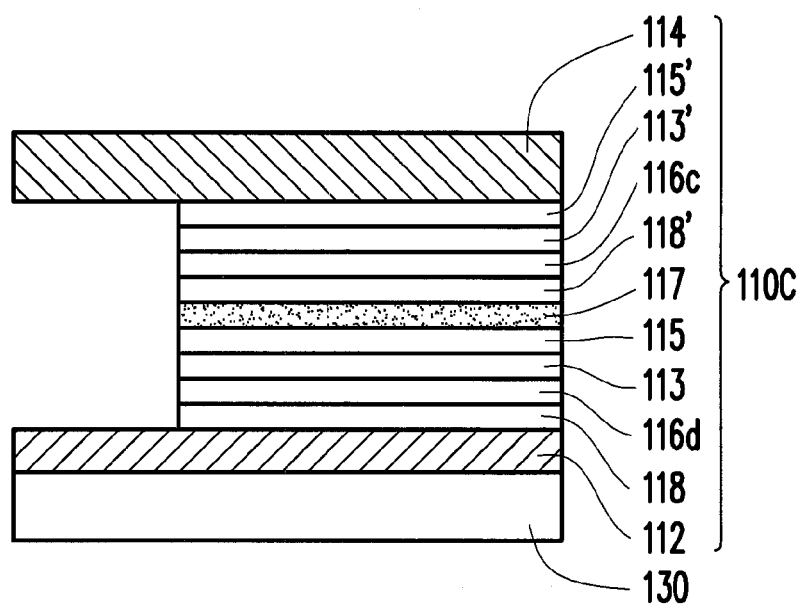

In another embodiment of the invention, as illustrated in FIG. 5D, a first organic electroluminescent device 110C includes the first anode 112, the first cathode 114, the conductive layer 117 disposed between the first anode 112 and the first cathode 114, the first primary color-second primary color organic electroluminescent layer 116d having a dopant for emitting first primary light (e.g. red light) and a dopant for emitting second primary light (e.g. green light) and disposed between the first anode 112 and the conductive layer 117, the first hole transport layer 118 disposed between the first anode 112 and the first primary color-second primary color organic electroluminescent layer 116d, the first electron transport layer 113 disposed between the first primary color-second primary color organic electroluminescent layer 116d and the conductive layer 117, the first electron injection layer 115 disposed between the first electron transport layer 113 and the conductive layer 117, the third primary color organic electroluminescent layer 116c having a dopant for emitting third primary light (e.g. blue light) and disposed between the first cathode 114 and the conductive layer 117, a second hole transport layer 118' disposed between the conductive layer 117 and the third primary color organic electroluminescent layer 116c, a second electron transport layer 113' disposed between the first cathode 114 and the third primary color organic electroluminescent layer 116c, and a second electron injection layer 115' disposed between the first cathode 114 and the second electron transport layer 113'. The conductive layer 117 is, for example, a transparent conductive layer. A material of the conductive layer 117 includes a metal oxide or other suitable oxides. For instance, a material of the conductive layer 117 includes ITO, IZO, ATO, AZO, IGZO, or a stacked layer including two of the above.

Figure 5E:
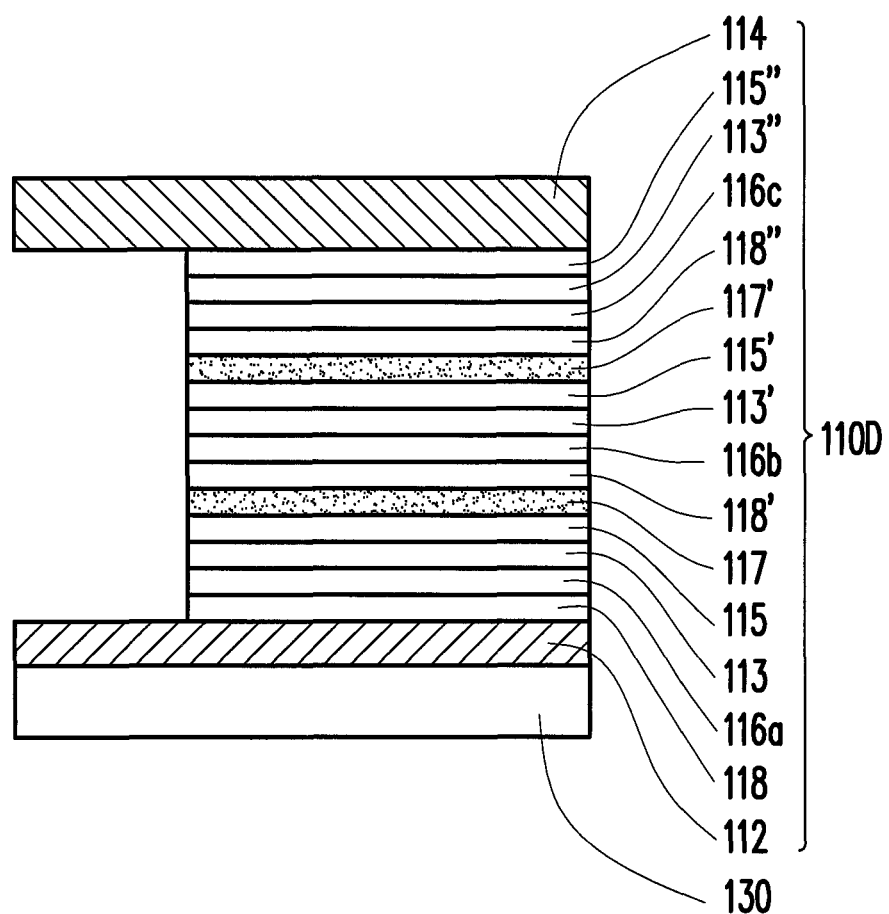

In another embodiment of the invention, as illustrated in FIG. 5E, a first organic electroluminescent device 110D includes the first anode 112, the first cathode 114, the first conductive layer 117 disposed between the first anode 112 and the first cathode 114, the first primary color organic electroluminescent layer 116a having a dopant for emitting first primary light (e.g. red light) and disposed between the first anode 112 and the first conductive layer 117, the first hole transport layer 118 disposed between the first anode 112 and the first primary color organic electroluminescent layer 116a, the first electron transport layer 113 disposed between the first primary color organic electroluminescent layer 116a and the first conductive layer 117, the first electron injection layer 115 disposed between the first electron transport layer 113 and the first conductive layer 117, a second conductive layer 117' disposed between the first conductive layer 117 and the first cathode 114, the second primary color organic electroluminescent layer 116b having a dopant for emitting second primary light (e.g. green light) and disposed between the first conductive layer 117 and the second conductive layer 117', a second hole transport layer 118' disposed between the first conductive layer 117 and the second primary color organic electroluminescent layer 116b, a second electron transport layer 113' disposed between the second primary color organic electroluminescent layer 116b and the second conductive layer 117', a second electron injection layer 115' disposed between the second electron transport layer 113' and the second conductive layer 117', the third primary color organic electroluminescent layer 116c having a dopant for emitting third primary light (e.g. blue light) and disposed between the first cathode 114 and the second conductive layer 117', a third hole transport layer 118" disposed between the second conductive layer 117' and the third primary color organic electroluminescent layer 116c, a third electron transport layer 113" disposed between the first cathode 114 and the third primary color organic electroluminescent layer 116c, and a third electron injection layer 115" disposed between the first cathode 114 and the third electron transport layer 113".

Second Embodiment

Figure 6:
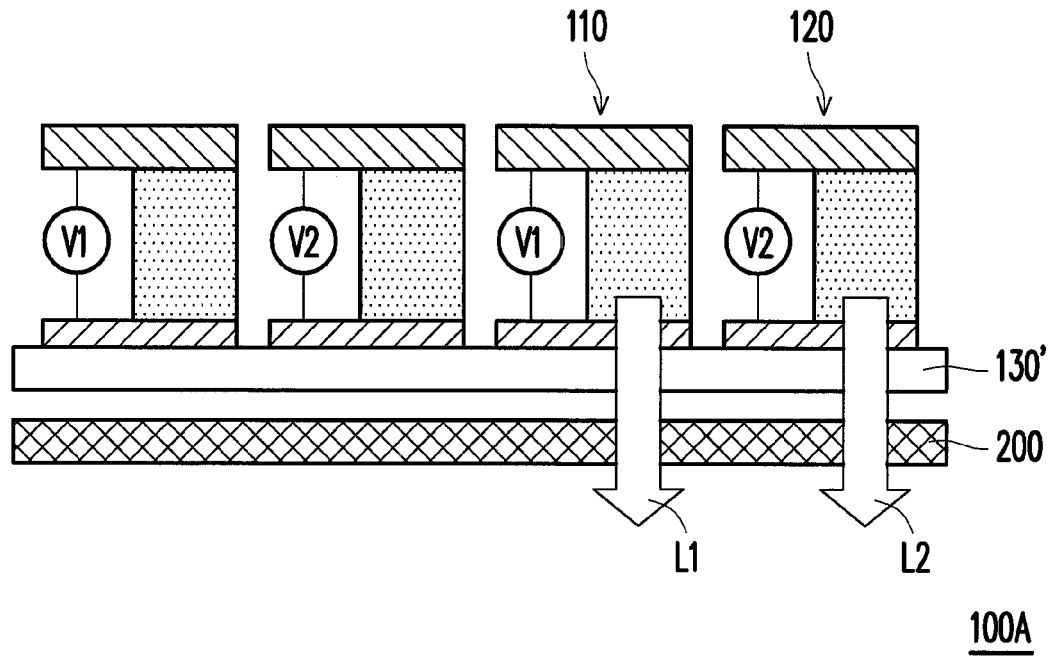
FIG. 6 is a schematic cross-sectional diagram of an organic electroluminescent light source according to a second embodiment of the invention.

FIG. 6 is a schematic cross-sectional diagram of an organic electroluminescent light source according to a second embodiment. Referring to FIG. 6, the organic electroluminescent light source 100A of the present embodiment is similar to the organic electroluminescent light source 100 in the first embodiment. However, the two light sources have some structural differences. The structural differences are illustrated in the following and the similarities of the two are not reiterated hereinafter.

The organic electroluminescent light source 100A of the present embodiment includes a first organic electroluminescent device 110 and a second organic electroluminescent device 120. The first organic electroluminescent device 110 is coupled to a first bias voltage V1 to emit a first color light L1 having a color temperature ranging from 2800K to 3500K. The second organic electroluminescent device 120 is coupled to a second bias voltage V2 to emit a second color light L2. The first color light L1 and the second color light L2 mix to generate a third color light having a color temperature ranging from 3500K to 6500K.

Different from that in the first embodiment, the organic electroluminescent light source 100A in the present embodiment further includes a substrate 130'. The first organic electroluminescent device 110 and the second organic electroluminescent device 120 are arranged on different regions of the substrate 130'. In details, in the present embodiment, the first organic electroluminescent device 110 and the second organic electroluminescent device 120 are arranged on the substrate 130' alternately. The first color light L1 emitted by the first organic electroluminescent device 110 and the second color light L2 emitted by the second organic electroluminescent device 120 of the present embodiment transmit to an optical diffuser film 200 for color mixing through the optical diffuser film 200. The organic electroluminescent light source 100A of the present embodiment and the organic electroluminescent light source 100 of the first embodiment have similar functions and advantages which are not reiterated hereinafter.

Third Embodiment

Figure 7:
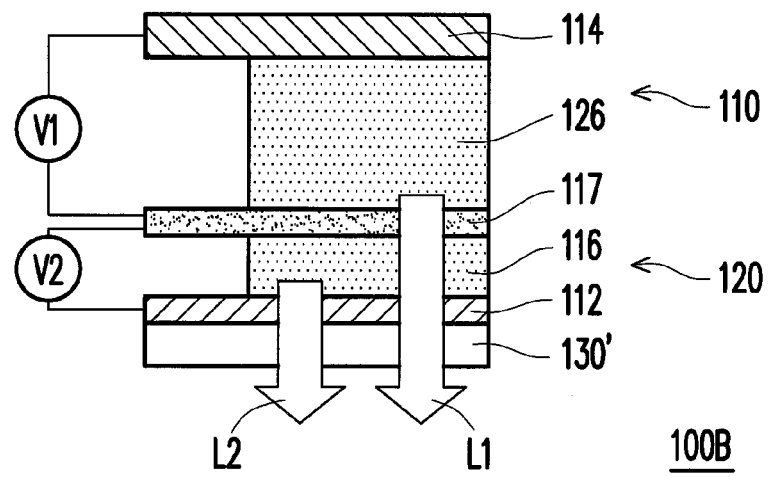
FIG. 7 depicts a schematic cross-sectional diagram of an organic electroluminescent light source according to a third embodiment of the invention.

FIG. 7 depicts a schematic cross-sectional diagram of an organic electroluminescent light source according to a third embodiment. Referring to FIG. 7, the organic electroluminescent light source 100B of the present embodiment is similar to the organic electroluminescent light source 100 in the first embodiment. However, the two light sources have some structural differences. The structural differences are illustrated in the following and the similarities of the two are not reiterated hereinafter.

The organic electroluminescent light source 100B of the present embodiment includes a first organic electroluminescent device 110 and a second organic electroluminescent device 120. The first organic electroluminescent device 110 is coupled to a first bias voltage V1 to emit a first color light L1 having a color temperature ranging from 2800K to 3500K. The second organic electroluminescent device 120 is coupled to a second bias voltage V2 to emit a second color light L2. The first color light L1 and the second color light L2 mix to generate a third color light having a color temperature ranging from 3500K to 6500K.

Different from that in the first embodiment, the organic electroluminescent light source 100B in the present embodiment further includes a substrate 130'. The first organic electroluminescent device 110 and the second organic electroluminescent device 120 are stacked on the substrate 130'. In details, the first organic electroluminescent device 110 and the second organic electroluminescent device 120 includes a first anode 112, a conductive layer 117, a first organic electroluminescent layer 116 disposed between the first anode 112 and the conductive layer 117, a first cathode 114, and a second organic electroluminescent layer 126 disposed between the first cathode 114 and the conductive layer 117. The positions of the first organic electroluminescent layer 116 and the second organic electroluminescent layer 126 can be switched. The first color light L1 emitted by the first organic electroluminescent device 110 and the second color light L2 emitted by the second organic electroluminescent device 120 both pass through the substrate 130' for color mixing. The organic electroluminescent light source 100B of the present embodiment and the organic electroluminescent light source 100 of the first embodiment have similar functions and advantages which are not reiterated hereinafter.

In summary, since the organic electroluminescent light source of the invention adopts a plurality of organic electroluminescent devices which is independently driven and has different color temperatures, the organic electroluminescent light source can thus have adaptive color temperature.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. An organic electroluminescent light source, comprising:
    a first organic electroluminescent device coupled to a first bias voltage to emit a first color light having a color temperature ranging from 2800K to 3500K; and
    a second organic electroluminescent device coupled to a second bias voltage to emit a second color light, wherein the first color light and the second color light mix to generate a third color light having a color temperature ranging from 3500K to 6500K;
    wherein the first color light is a white light having three intensity peaks and the second color light includes a blue light and has a color temperature higher than the color temperature of the first color light.

2. The organic electroluminescent light source as claimed in claim 1, wherein the first bias voltage is a fixed bias voltage and the second bias voltage is an adaptive bias voltage.

3. The organic electroluminescent light source as claimed in claim 1, wherein the first organic electroluminescent device comprises:
    a first anode;
    a first cathode; and
    a first organic electroluminescent layer disposed between the first anode and the first cathode.

4. The organic electroluminescent light source as claimed in claim 3, wherein the first organic electroluminescent device further comprises:
    a first hole transport layer disposed between the first anode and the first organic electroluminescent layer;
    a first electron transport layer disposed between the first organic electroluminescent layer and the first cathode; and
    a first electron injection layer disposed between the first electron transport layer and the first cathode, wherein the first organic electroluminescent layer is sandwiched between the first electron transport layer and the hole transport layer.

5. The organic electroluminescent light source as claimed in claim 4, wherein the first organic electroluminescent layer comprises a first color organic electroluminescent layer.

6. The organic electroluminescent light source as claimed in claim 5, wherein the first organic electroluminescent layer further comprises a second color organic electroluminescent layer.

7. The organic electroluminescent light source as claimed in claim 6, wherein the first organic electroluminescent layer further comprises a third color organic electro luminescent layer.

8. The organic electroluminescent light source as claimed in claim 4, wherein the first organic electroluminescent layer comprises:
    a first primary color organic electroluminescent layer having a dopant for emitting first primary color light;
    a second primary color organic electroluminescent layer having a dopant for emitting second primary color light; and
    a third primary color organic electroluminescent layer having a dopant for emitting third primary color light, wherein the first primary color organic electroluminescent layer, the second primary color organic electroluminescent layer, and the third primary color organic electroluminescent layer are stacked between the first anode and the first cathode.

9. The organic electroluminescent light source as claimed in claim 4, wherein the first organic electroluminescent layer comprises:
- a first primary color-second primary color organic electroluminescent layer having a dopant for emitting first primary color light and a dopant for emitting second primary color light; and
- a third primary color organic electroluminescent layer having a dopant for emitting third primary color light.

10. The organic electroluminescent light source as claimed in claim 4, wherein the first organic electroluminescent layer comprises a first primary color-second primary color-third primary color organic electroluminescent layer having a dopant for emitting first primary color light, a dopant for emitting second primary color light, and a dopant for emitting third primary color light.

11. The organic electroluminescent light source as claimed in claim 4, wherein the first organic electroluminescent layer comprises:
- a yellow organic electroluminescent layer having a dopant for emitting yellow light; and
- a blue organic electroluminescent layer having a dopant for emitting blue light, wherein the yellow organic electroluminescent layer and the blue organic electroluminescent layer are stacked between the first anode and the first cathode.

12. The organic electroluminescent light source as claimed in claim 1, wherein the first organic electroluminescent device comprises:
- a first anode;
- a first cathode;
- a first conductive layer disposed between the first anode and the first cathode;
- a first primary color organic electroluminescent layer having a dopant for emitting first primary color light, the first primary color organic electroluminescent layer being disposed between the first anode and the first conductive layer;
- a first hole transport layer disposed between the first anode and the first primary color organic electroluminescent layer;
- a first electron transport layer disposed between the first primary color organic electroluminescent layer and the first conductive layer;
- a first electron injection layer disposed between the first electron transport layer and the first conductive layer;
- a second conductive layer disposed between the first conductive layer and the first cathode;
- a second primary color organic electroluminescent layer having a dopant for emitting second primary color light, the second primary color organic electroluminescent layer being disposed between the first conductive layer and the second conductive layer;
- a second hole transport layer disposed between the first conductive layer and the second primary color organic electroluminescent layer;
- a second electron transport layer disposed between the second primary color organic electroluminescent layer and the second conductive layer;
- a second electron injection layer disposed between the second electron transport layer and the second conductive layer;
- a third primary color organic electroluminescent layer having a dopant for emitting third primary color light, the third primary color organic electroluminescent layer being disposed between the first cathode and the second conductive layer;
- a third hole transport layer disposed between the second conductive layer and the third primary color organic electroluminescent layer;
- a third electron transport layer disposed between the first cathode and the third primary color organic electroluminescent layer; and
- a third electron injection layer disposed between the first cathode and the third electron transport layer.

13. The organic electroluminescent light source as claimed in claim 1, wherein the second organic electroluminescent device comprises:
- a second anode;
- a second cathode; and
- a second organic electroluminescent layer disposed between the second anode and the second cathode.

14. The organic electroluminescence light source as claimed in claim 1, further comprising:
- a first substrate; and
- a second substrate, wherein the first organic electroluminescent device is disposed on the first substrate and the second organic electroluminescent device is disposed on the second substrate.

15. The organic electroluminescent light source as claimed in claim 14, wherein the first substrate carrying the first organic electroluminescent device and the second substrate carrying the second organic electroluminescent device are stacked together.

16. The organic electroluminescent light source as claimed in claim 1, further comprising a substrate, wherein the first organic electroluminescent device and the second organic electroluminescent device are arranged on different regions of one surface of the substrate.

17. The organic electroluminescent light source as claimed in claim 16, wherein the first organic electroluminescent device and the second organic electroluminescent device are arranged on the substrate alternately.

18. The organic electroluminescent light source as claimed in claim 1, further comprising a substrate, wherein the first organic electroluminescent device and the second organic electroluminescent device are stacked on the substrate.

19. The organic electroluminescent light source as claimed in claim 18, wherein the first organic electroluminescent device and the second organic electroluminescent device comprise:
- a first anode;
- a conductive layer;
- a first organic electroluminescent layer disposed between the first anode and the conductive layer;
- a first cathode; and
- a second organic electroluminescent layer disposed between the first cathode and the conductive layer.

20. The organic electroluminescent light source as claimed in claim 1, wherein the first organic electroluminescent device comprises:
- a first anode;
- a first cathode;
- a conductive layer disposed between the first anode and the first cathode;
- a first primary color-second primary color organic electroluminescent layer having a dopant for emitting first primary color light and a dopant for emitting second primary color light, the first primary color-second primary color organic electroluminescent layer being disposed between the first anode and the conductive layer;
- a first hole transport layer disposed between the first anode and the first primary color-second primary color organic electroluminescent layer;

a first electron transport layer disposed between the first primary color-second primary color organic electroluminescent layer and the conductive layer;

a first electron injection layer disposed between the first electron transport layer and the conductive layer;

a third primary color organic electroluminescent layer having a dopant for emitting third primary color light, the third primary color organic electroluminescent layer being disposed between the first cathode and the conductive layer;

a second hole transport layer disposed between the conductive layer and the third primary color organic electroluminescent layer;

a second electron transport layer disposed between the first cathode and the third primary color organic electroluminescent layer; and a second electron injection layer disposed between the first cathode and the second electron transport layer.

* * * * *